US007605740B2

(12) United States Patent
Pelgrom et al.

(10) Patent No.: US 7,605,740 B2
(45) Date of Patent: Oct. 20, 2009

(54) FLASH ANALOG-TO-DIGITAL CONVERTER

(75) Inventors: Marcel Pelgrom, Helmond (NL); Atul Katoch, Kanata (CA); Maarten Vertregt, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/097,040

(22) PCT Filed: Dec. 8, 2006

(86) PCT No.: PCT/IB2006/054704

§ 371 (c)(1),
(2), (4) Date: Jun. 11, 2008

(87) PCT Pub. No.: WO2007/069160

PCT Pub. Date: Jun. 21, 2007

(65) Prior Publication Data

US 2008/0309541 A1 Dec. 18, 2008

(30) Foreign Application Priority Data

Dec. 12, 2005 (EP) .................................. 05111980

(51) Int. Cl.
*H03M 1/36* (2006.01)
(52) U.S. Cl. ....................... 341/159; 341/155
(58) Field of Classification Search ................. 341/159, 341/155, 158, 160, 161, 163, 120, 121
See application file for complete search history.

(56) References Cited

U.S. PATENT DOCUMENTS

| 4,459,580 | A | | 7/1984 | Furukawa |
| 5,416,485 | A | * | 5/1995 | Lee ............................. 341/172 |
| 5,739,782 | A | | 4/1998 | Uda |
| 6,281,828 | B1 | * | 8/2001 | Kimura et al. .............. 341/155 |
| 6,621,440 | B2 | | 9/2003 | Gorman |
| 2002/0145552 | A1 | | 10/2002 | Gorman |
| 2002/0167436 | A1 | | 11/2002 | Bult et al. |
| 2003/0201823 | A1 | * | 10/2003 | McGowan ..................... 330/9 |

FOREIGN PATENT DOCUMENTS

DE 19528403 A1 3/1996

OTHER PUBLICATIONS

Sall, E; et al "A Dynamic Element Matching Technique for Flash Analog-To-Digital Converters" Signal Processing Symposium, 2004. Norsig 2004. Proceedings of The 6th Nordic Espoo, Finland. Jun. 9, 2004, pp. 137-140.

(Continued)

*Primary Examiner*—Brian Young

(57) ABSTRACT

A flash analog-to-digital converter comprises a resistive string powered by a reference voltage source for providing a set of equidistant reference voltages and a set of comparators for comparing the analog input signal with the reference voltages. A set of switches are arranged and controlled to perform an algorithm for mitigating the influence of mismatches between the components. The switches are arranged between the reference voltage source and the resistive string so that switches in the reference inputs to the comparators are avoided. The resistive string is preferably circular. The converter can handle differential signals.

7 Claims, 3 Drawing Sheets

OTHER PUBLICATIONS

Figure 1:
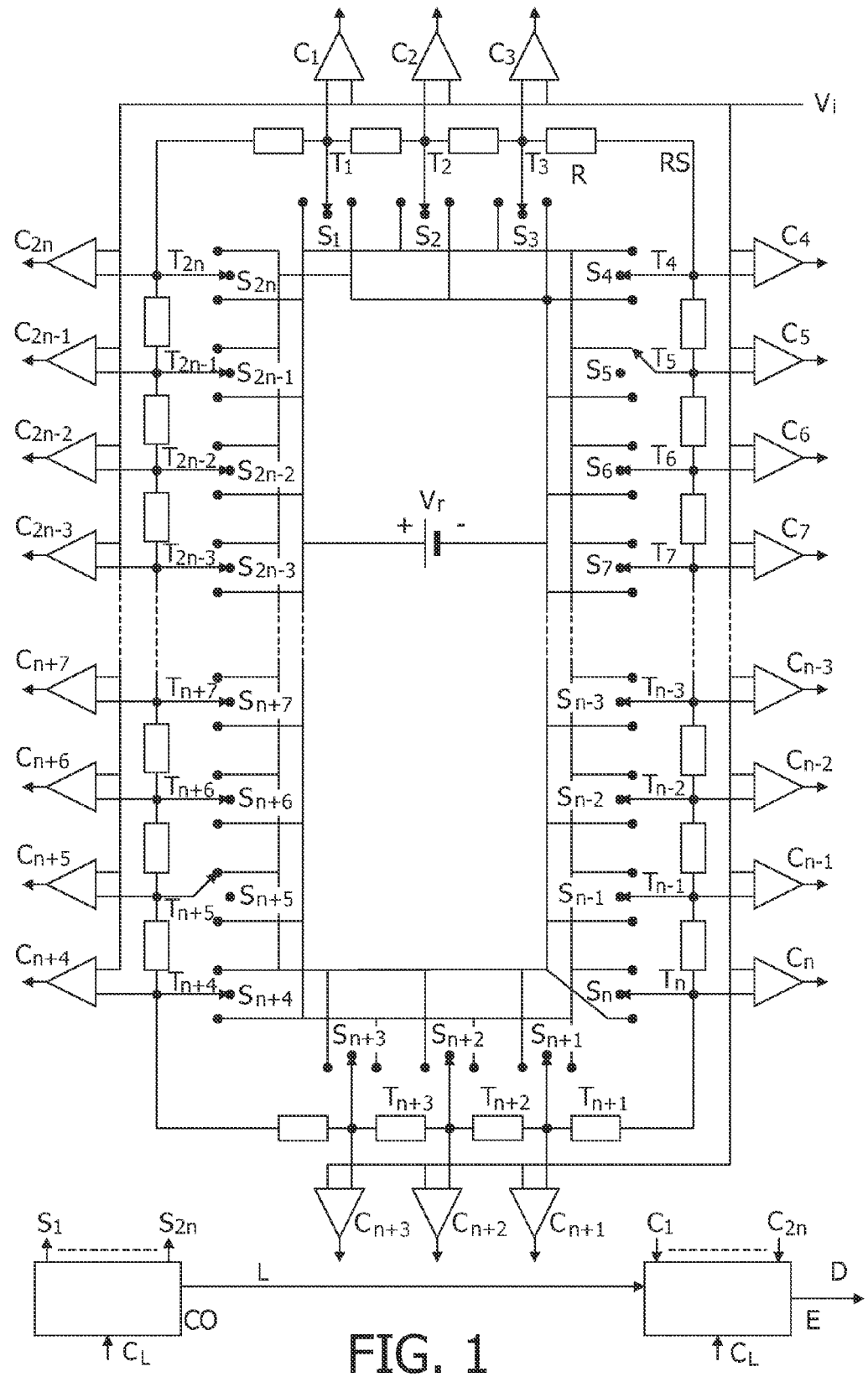

Carbone, Paolo; et al "Stochastic-Flash Analog-To-Digital Conversion" IEEE Transactions on Instrumentation and Measurement, vol. 47, No. 1, Feb. 1998, pp. 65-68.

Choi, Michael; et al "A 6-B 1.3-Gsample/S A/D Converter in 0.35-UM CMOS" IEEE Journal of Solid-State Circuits, vol. 36, No. 12, Dec. 2001, pp. 1847-1858.

Radke, R. E; et al "A 14-Bit Current-Mode Sigma Delta DAC Based Upon Rotated Data Weighted Averaging" IEEE Journal of Solid-State Circuits, vol. 35, Issue 8, Aug. 2000, pp. 1074-1084.

Barkin, D. B; et al "A CMOS Oversampling Bandpass Cascaded D/A Converter With Digital FIR and Current-Mode SEMI Digital Filtering" IEEE Journal of Solid-State Circuits, vol. 39, Issue 4, April 2004, pp. 585-593.

* cited by examiner

FLASH ANALOG-TO-DIGITAL CONVERTER

The invention relates to a flash analog-to-digital converter for converting an analog input signal to a digital output code that is representative of the input signal, said analog-to-digital converter comprising a resistive string of substantially equal valued resistors and powered by a reference voltage source for providing a plurality of equidistant reference voltages, a set of comparators for comparing the analog input signal with said plurality of reference voltages, an encoder receiving the result of the set of comparators and deriving therefrom the digital output code and switching means arranged and controlled to perform a mismatch mitigating algorithm.

Such flash analog-to-digital converter is e.g. known from U.S. Pat. No. 6,281,828 B1. In flash analog-to-digital converters it is the purpose of each comparator to determine whether the analog input signal is above or below the reference voltage applied to the comparator. All comparators having a reference voltage higher than the analog input signal will generate e.g. a "zero" and all comparators having a reference voltage lower than the analog input signal will generate a "one". The complete set of comparators therefore gives the digital representation of the input signal in the form of a thermometer code. This thermometer code may subsequently be converted to e.g. a PCM code in the encoder. The analog-to-digital converter operates very fast because all comparators may operate simultaneously on one single clock-edge to generate a sample of the digital output code.

The precision of such analog-to-digital converter is seriously impaired by mismatches of the MOS transistors in the comparators because these mismatches cause random offset voltages in the inputs of the comparators. The difference between the offset voltage of one comparator and of its equally designed neighbor can easily be of the order of 5 to 10 millivolt, while accuracies of less than 1 mV are desired in modern signal processing. As a certain input level is discriminated by one single comparator, an offset of this comparator will degrade the accuracy of the decision always at that particular input level. This gives rise to an unacceptable high non-linear distortion of the converted signal.

Therefore, the abovementioned US patent discloses an arrangement in which a certain input level is no longer discriminated by one particular comparator but, in stead thereof, the comparators are interchanged so that one particular comparator, which is used to discriminate one input level during a clock cycle, is used to discriminate other input levels during next clock cycles. More particularly: each comparator is selected to discriminate many or all input levels in accordance with a (pseudo) random mismatch-mitigating algorithm. The result is that the non-linear distortion that occurs in a flash analog-to-digital converter without mismatch mitigation, is transferred to a high-frequency noise in a frequency range where the converted signal is distorted to a much lesser extend.

In the abovementioned US patent (FIG. 8) the mismatch mitigating algorithm is carried out with a switching circuit that enables the reference input of each comparator to be connected to each of the taps of the resistive string. However an important problem of such prior art analog-to-digital converter is that the many switching-transistors between the taps of the resistive string and the reference inputs of the comparators present a large capacitance (10-20 pF total switch capacitance) between these comparator inputs and the supply voltage level to which the gates of these switching-transistors are connected when the switch is conducting. These capacitances severely slow down the speed of the analog-to-digital converter. Another problem is that always-present fluctuations on the supply voltage will be coupled through these capacitances to the inputs of the comparators, where they impair the precision of the conversion operation.

The present invention seeks to overcome the mentioned disadvantages of the prior art analog-to-digital converters and the analog-to-digital converter of the invention is therefore characterized in that the switching means performing the mismatch mitigating algorithm are arranged between said reference voltage source and the resistive string to switch the reference voltage source at different clock cycles across different parts of the string, whereby each of said parts of the string comprises a fixed number of resistors.

In this way, again, each level of the analog input signal is discriminated with a plurality of comparators, so that the mismatches of the comparator offsets are averaged and transferred to high frequency noise. However, because there are no switches in the connections between the resistor taps and the comparator inputs, the impairments caused by the gate-channel capacitances of these switches no longer exist. Moreover, each analog input level is now discriminated with a plurality of string resistors, so that also mismatches between these resistors are averaged. The price that has to be paid for these advantages is that a resistive string with a larger number of resistors has to be used than in prior art flash analog-to-digital converters.

The flash analog-to-digital converter of the present invention may further be characterized in that the resistive string of substantially equal valued resistors is a circular resistive string. With other words, the two ends of a linear string are connected together. The linear string has the limitation that the positive terminal of the reference voltage source may not be connected to the lower part of the string and equally that the negative terminal of the reference voltage source may not be connected to the higher part of the string. Therefore the range of variation of components that is required for the mismatch mitigation is limited. With a circular string this limitation does not exist.

The flash analog-to-digital converter of the present invention with the circular resistive string may be further characterized in that at any clock cycle the reference voltage source is switched between two diagonally opposite tabs of the circular resistive string. This implementation gives an optimum trade off between the number of resistors contained in the string and the power dissipation in the string. Moreover this implementation allows the use of both halves of the circular string simultaneously for comparing the analog input signal with the reference voltages supplied by the resistive string. A special advantageous use of this implementation is characterized in that the analog input signal is a differential signal, that one of the parts of the differential signal is compared with the reference voltages supplied by the taps of the half circular resistive string at one side of the connections of the reference voltage source and that the other part of the differential signal is compared with the reference voltages supplied by the taps of the half circular resistive string at the other side of the connections of the reference voltage source. In his way each of the tabs of the circular resistive string is at each clock cycle used for the analog-to-digital conversion of the analog input signal.

It is noted that in applicant's U.S. Pat. No. 6,621,440 B2 an arrangement is disclosed with a linear or circular resistive string to controllable parts of which a reference voltage source is connected through switches. In this arrangement the switches are controlled by a digital input signal and an analog signal output is connected to the string. It is the purpose of this arrangement to digital-to-analog convert the digital input signal and to obtain the converted analog signal from the output of the string. There are no comparators in this prior art digital-to-analog converter and it is not the purpose of the switches to mitigate component mismatches.

Figure 2I:
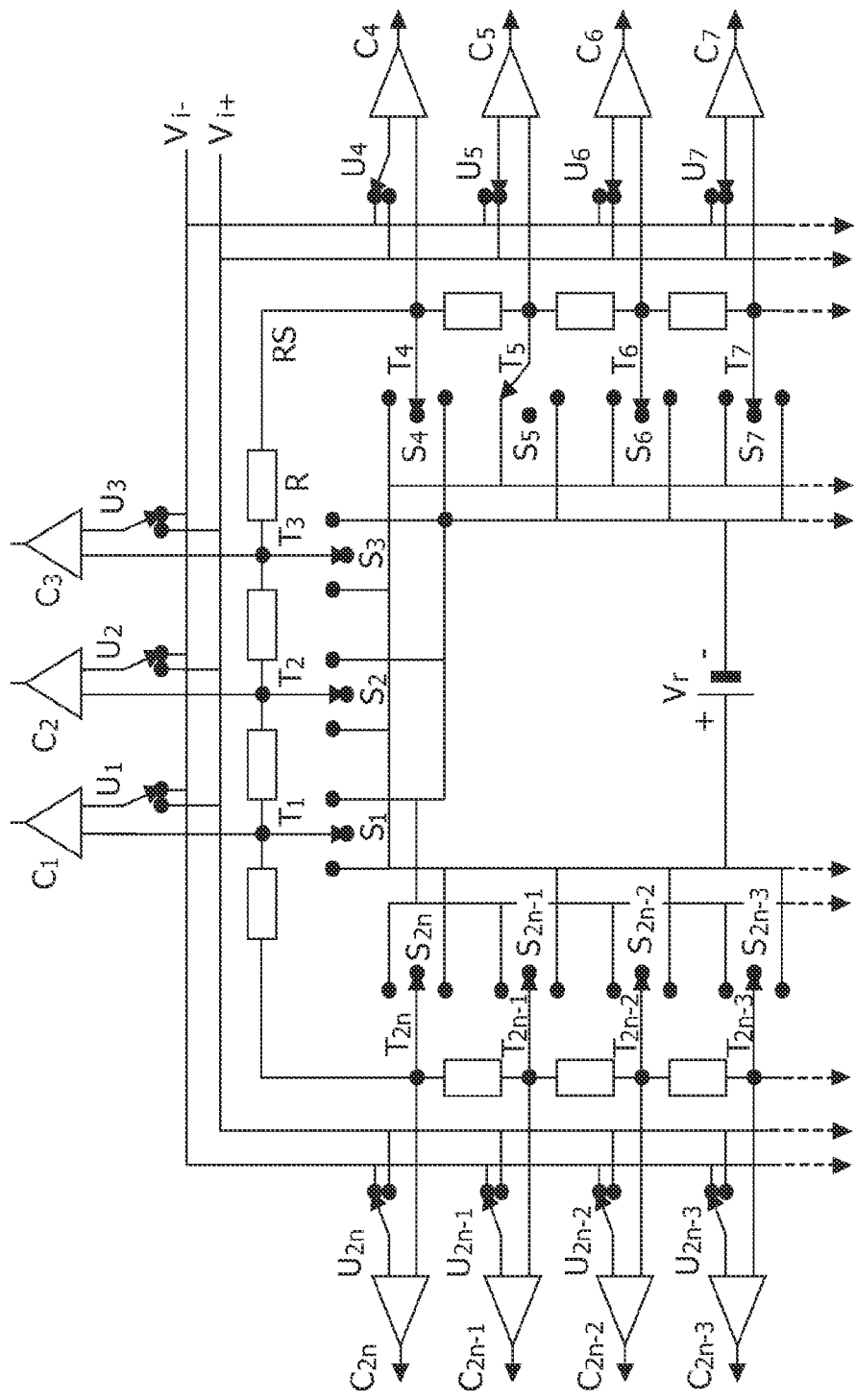
Figure 2I:
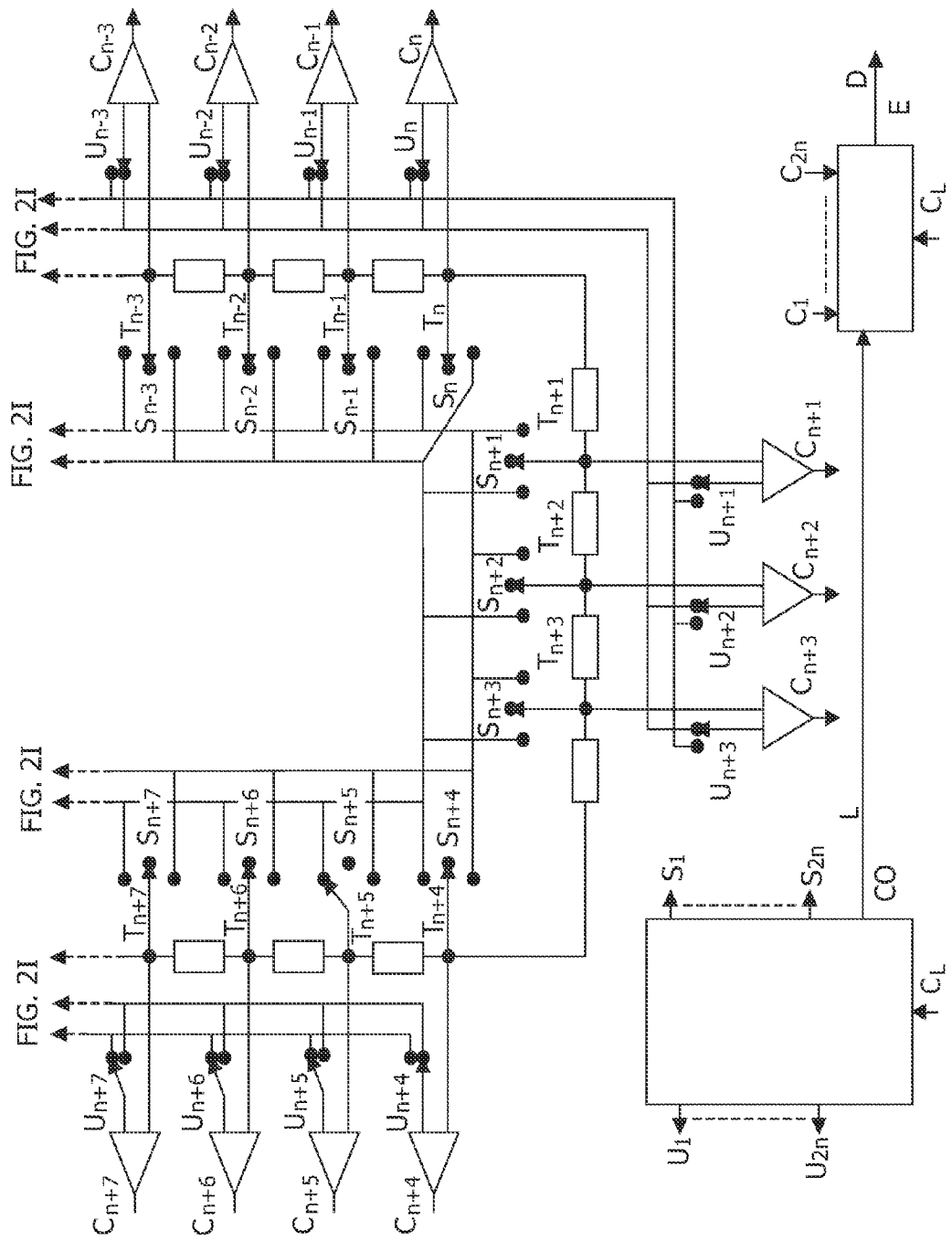

The invention will be further explained with reference to the accompanying figures. Herein shows:

FIG. 1 a first embodiment of a flash analog-to-digital converter in accordance with the invention and FIG. 2 a second embodiment of a flash analog-to-digital converter in accordance with the invention.

The flash analog-to-digital converter of FIG. 1 has a circular resistor string RS consisting of an even number 2n of equal valued resistors R. The connections between these resistors form 2n taps $T_1 \ldots T_{2n}$. Each of these taps is connected to a reference input of a comparator $C_1 \ldots C_{2n}$. Each of these comparators $C_1 \ldots C_{2n}$ has a signal input connected to receive an analog input signal $V_i$. The output terminals of the comparators are connected to a clock-controlled encoder E that converts the output signals of the comparators to a digital PCM code D.

The 2n taps $T_1 \ldots T_{2n}$ of the resistor string RS are connected to an equal number of three-position switches $S_1 \ldots S_{2n}$. Each of these switches connects its respective tap to the+terminal of a reference voltage source $V_r$ in one position, to the−terminal of the reference voltage source $V_r$ in a second position and is non-connected in the third position. A clock-controlled controller CO controls the switches $S_1 \ldots S_{2n}$. For each sample of the digital output signal D this controller sets one of the switches in the first position and the switch located diagonally opposite thereto in the circular string in the second position. All other switches are set in the third, unconnected, position. In the arrangement of FIG. 1 the switch $S_5$ is in the first position, the diagonally opposite switch $S_{n+5}$ in the second position and the switches $S_1 \ldots S_4, S_6 \ldots S_{n+4}$ and $S_{n+6} \ldots S_{2n}$ are in the third position. The result is that for this sample the reference voltage source $V_r$ is connected between the taps $T_5$ and $T_{n+5}$ of the circular resistor string ST, so that two halves of the circular string, each of n resistors R, are powered by the reference voltage source $V_r$.

The analog input voltage $V_i$ is compared by the comparators connected to one half of the circular string whereby the comparators with a reference voltage lower than the analog input voltage generate e.g. a "one" and the comparators with a reference voltage higher than the analog input voltage generate a "zero". Therefore the outputs of the comparators $C_5 \ldots C_{n+5}$ together generate a digital thermometer code of the analog input signal and this thermometer code may subsequently be converted in the encoder E to a sample of the digital PCM signal D. It may be noted that a second substantially identical thermometer code is generated at the outputs of the comparators connected to the other half of the circular string, but this second thermometer code remains unused.

As has already been observed in the introductory part of his patent application, the thermometer code generated by the comparators and therewith the digital code generated by the encoder E may be corrupted by component mismatches, especially the mismatches in the offset voltages of the comparators. To mitigate this mismatch-corruption the reference voltage source $V_r$ is connected for the generation of the next sample between two other diagonally opposite taps of the circular string e.g. the taps $T_6$ and $T_{n+6}$. Thereto the controller CO sets the switches $S_5$ and $S_{n+5}$ in their non-connected position, the switch $S_6$ in its position to connect to the+terminal of the reference voltage source $V_r$ and the switch $S_{n+6}$ in its position to connect to the−terminal of the reference voltage source $V_r$. The changed position of the reference voltage source is communicated through a lead L to the encoder E, so that the encoder now encodes the thermometer code of the comparators $C_6 \ldots C_{n+6}$.

For the generation of the next sample the reference voltage source $V_r$ may be connected to the taps $T_7$ and $T_{n+7}$ of the circular string and so on. Because all comparators are equally designed, all resistors of the string are substantially equally valued and because the reference voltage source Vr is always connected across the same number (n) of resistors, the configuration of the analog-to-digital converter and consequently the basic analog-to-digital conversion operation is not affected by the switching of the reference voltage source in the circular string. The effect of this switching is only that individual components (comparators and resistors) have changed their position in the configuration with the result that errors resulting from mismatches of the components appear as high frequency noise rather than as non-linear distortion of the converted signal. The mismatching will be better mitigated when the switching operation is executed in a random fashion rather than when this is done in a regular fashion. A simple and easy algorithm for executing the switching operation in a pseudo random fashion without the need of a random generator is to switch the reference voltage source to a tap of the string where in the previous clock cycle the jump in the thermometer code has occurred. This switch sequence will selectively reduce the noise at low frequencies and is from a signal processing point of view identical to what is per se known in digital-to-analog conversion as "rotated data weighted averaging". See e.g. "A 14-bit current mode ΣΔ DAC Based Upon Rotated Data Weighted Averaging" by Radke, R. E.; Eshraghi, A.; Fiez, T. S.; IEEE Journal of Solid-State Circuits, Volume 35Issue 8August 2000 Page(s): 1074-1084.

In general switching sequences that have been described for selective noise reduction in digital-to-analog conversion can be applied with the same effect in analog-to-digital converters according to the present invention. For instance, a switching sequence where the noise in a digital-to-analog converter is removed in a bandpass is presented in the article: "A CMOS Oversampling Bandpass Cascaded D/A Converter with Digital FIR and Current-Mode Semi Digital Filtering." By Barkin, D. B.; Lin, A. C. Y.; Su, D. K.; Wooley, B. A.; Journal of Solid-State Circuits, Volume 39Issue 4April 2004Page(s): 585-593A corresponding switching sequence may be used in an analog-to-digital converter of the present invention to remove noise from a bandpass.

In the arrangement of FIG. 1 various modifications may be made without departing from the scope of the invention. For instance, the reference voltage source need not necessarily be connected to opposite taps of the circular string. When the part of the circular string that is used for the analog-to-digital conversion contains n resistors and when the unused part of the string has m resistors, then m may be unequal to n. A choice wherein m is larger than n will reduce the power dissipation in the string and will increase the connection range, i.e. the number of possible positions, of the reference voltage source in the string, but at the cost of more resistors. On the other hand, reducing the number of resistors in the circular string (m<n) will increase the power dissipation and will decrease the connection range of the reference voltage source. Therefore in practice a circular string where the reference voltage source divides the string in two equal halves of n resistors each may well be optimal.

Another modification of the arrangement of FIG. 1 is that the circular string is broken e.g. by deleting the resistor between the taps $T_1$ and $T_{2n}$, so that the string is not anymore circular but linear. This modification reduces the power dissipation in the unused part(s) of the string to zero. On the other hand, when the number (m) of resistors in the unused part(s) of the string is substantially smaller than the number (n) of resistors in the used part of the string, this modification substantially reduces the connection range of the reference voltage source (from n+m to 2m+1).

In the analog-to-digital converter of FIG. 1 only one half of the circular string is used for the analog-to-digital conversion of the input signal to a digital sample while the other half remains unused but must be present to create a connection range for the mismatch mitigation. In the analog-to-digital converter of FIG. 2 the unused half of the circular string is advantageously used for the conversion of the second part of a differential analog input signal $V_{i+}$, $V_{i-}$. For this purpose each of the comparators $C_1 \ldots C_{2n}$ has a polarity switch $U_1 \ldots U_{2n}$ to switch the signal input of the comparators from the $V_{i+}$ to the $V_{i-}$ terminal or vice versa. Changing the position of the reference voltage source $V_r$ in the circular string means that also the comparator inputs must be switched between the two input terminals. In FIG. 2, wherein the temporary situation is depicted that the reference voltage source is connected between the taps $T_5$ and $T_{n+5}$ of the circular string, the polarity switches $U_5$ to $U_{n+4}$ connect the signal input of their comparators to the $V_{i+}$ signal input terminal while the polarity switches $U_4$ to $U_{n+5}$ connect the signal input of their comparators to the $V_{i-}$ signal input terminal. The polarity switches $U_1 \ldots U_{2n}$ receive their information from the controller CO.

It will be apparent that in the differential analog-to-digital converter of FIG. 2 the circular string cannot be broken to a linear string and also that the reference voltage source should always be connected in a diagonal of the circular string so that the string is always divided into two equal half strings.

As has been noted in the preamble to this application the switches in the reference inputs of the comparators are avoided because the parasitic capacitances of such switches would adversely affect the speed and the precision of the analog-to-digital converter. Similar effects of the switches $U_1 \ldots U_{2n}$ in the signal inputs to the comparators can be avoided by using low impedance sources for delivering the analog signal $V_{i+}$, $V_{i-}$.

In summary the invention relates to a flash analog-to-digital converter that comprises a resistive string powered by a reference voltage source for providing a set of equidistant reference voltages and a set of comparators for comparing the analog input signal with the reference voltages. A set of switches are arranged and controlled to perform an algorithm for mitigating the influence of mismatches between the components. The switches are arranged between the reference voltage source and the resistive string so that switches in the reference inputs to the comparators are avoided. The resistive string is preferably circular. The converter can handle differential signals.

The invention claimed is:

1. A flash analog-to-digital converter for converting an analog input signal to a digital output code that is representative of the input signal, said analog-to-digital converter comprising a resistive string of substantially equal valued resistors and powered by a reference voltage source for providing a plurality of equidistant reference voltages, a set of comparators for comparing the analog input signal with said plurality of reference voltages, an encoder receiving the result of the set of comparators and deriving therefrom the digital output code and a switching circuit arranged and controlled to perform a mismatch mitigating algorithm, characterized in that the switching circuit is arranged between said reference voltage source and the resistive string to switch the reference voltage source at different clock cycles across different parts of the string in a systematic manner, wherein each of said parts comprises a fixed number of resistors.

2. A flash analog-to-digital converter for converting an analog input signal to a digital output code that is representative of the input signal, said analog-to-digital converter comprising a circular resistive string of substantially equal valued resistors and powered by a reference voltage source for providing a plurality of equidistant reference voltages, a set of comparators for comparing the analog input signal with said plurality of reference voltages, an encoder receiving the result of the set of comparators and deriving therefrom the digital output code and a switching circuit arranged and controlled to perform a mismatch mitigating algorithm, characterized in that the switching circuit is arranged between said reference voltage source and the resistive string to switch the reference voltage source at different clock cycles across different parts of the string, wherein each of said parts comprises a fixed number of resistors.

3. A flash analog-to-digital converter as claimed in claim 2 characterized in that at any clock cycle the reference voltage source is switched between two diagonally opposite tabs of the circular resistive string.

4. A flash analog-to-digital converter as claimed in claim 3 characterized in that the analog input signal is a differential signal, that one of the parts of the differential signal is compared with the reference voltages supplied by the taps of the half circular resistive string at one side of the connections of the reference voltage source and that the other part of the differential signal is compared with the reference voltages supplied by the taps of the half circular resistive string at the other side of the connections of the reference voltage source.

5. A flash analog-to-digital converter as claimed in claim 2, wherein the reference voltage source is arranged to divide the string in two equal halves of n resistors, where n is greater than one.

6. A flash analog-to-digital converter for converting an analog input signal to a digital output code that is representative of the input signal, said analog-to-digital converter comprising a linear resistive string of substantially equal valued resistors and powered by a reference voltage source for providing a plurality of equidistant reference voltages, a set of comparators for comparing the analog input signal with said plurality of reference voltages, an encoder receiving the result of the set of comparators and deriving therefrom the digital output code and switching means arranged and controlled to perform a mismatch mitigating algorithm, characterized in that the switching means are arranged between said reference voltage source and the resistive string to switch the reference voltage source at different clock cycles across different parts of the string, in a systematic manner wherein each of said parts comprises a fixed number of resistors.

7. A flash analog-to-digital converter for converting an analog input signal to a digital output code that is representative of the input signal, said analog-to-digital converter comprising a resistive string of substantially equal valued resistors and powered by a reference voltage source for providing a plurality of equidistant reference voltages, a set of comparators for comparing the analog input signal with said plurality of reference voltages, an encoder receiving the result of the set of comparators and deriving therefrom the digital output code and switching means arranged and controlled to perform a mismatch mitigating algorithm, characterized in that the switching means are arranged between said reference voltage source and the resistive string to switch the reference voltage source at different clock cycles across different parts of the string, in a non-arbitrary manner wherein each of said parts comprises a fixed number of resistors.

* * * * *